United States Patent
Lee

(10) Patent No.: US 6,844,239 B2
(45) Date of Patent: Jan. 18, 2005

(54) METHOD FOR FORMING SHALLOW WELL OF SEMICONDUCTOR DEVICE USING LOW-ENERGY ION IMPLANTATION

(75) Inventor: Jae-Kyu Lee, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/626,248

(22) Filed: Jul. 23, 2003

(65) Prior Publication Data

US 2004/0132263 A1 Jul. 8, 2004

(30) Foreign Application Priority Data

Jul. 24, 2002 (KR) .................. 10-2002-0043698

(51) Int. Cl.⁷ .............................................. H01L 21/76
(52) U.S. Cl. .................. 438/433; 438/424; 438/435; 438/437
(58) Field of Search ................. 438/424, 433, 438/435, 437

(56) References Cited

U.S. PATENT DOCUMENTS

| 5,563,091 A | * 10/1996 | Lee ........................... 438/450 |
| 5,770,504 A | * 6/1998 | Brown et al. ............... 438/296 |
| 6,144,086 A | * 11/2000 | Brown et al. ............... 257/510 |
| 6,248,645 B1 | * 6/2001 | Matsuoka et al. .......... 438/424 |
| 2002/0086499 A1 | * 7/2002 | Sridhar et al. .............. 438/433 |

* cited by examiner

*Primary Examiner*—Michael S. Lebentritt
*Assistant Examiner*—Christian D. Wilson
(74) *Attorney, Agent, or Firm*—Marger Johnson & McCollom, P.C.

(57) ABSTRACT

A method for forming a shallow well of a semiconductor device using low-energy ion implantation is described. A well region is formed to the depth of a trench isolation layer using a low-energy, high-dose ion implantation process. The method for forming a well using low-energy ion implantation can minimize well margin reduction caused by impurity spread and well margin reduction caused by shrinkage of a thick photoresist pattern.

20 Claims, 6 Drawing Sheets

METHOD FOR FORMING SHALLOW WELL OF SEMICONDUCTOR DEVICE USING LOW-ENERGY ION IMPLANTATION

BACKGROUND OF THE INVENTION

This application claims priority from Korean Patent Application No. 2002-43698, filed on Jul. 24, 2002, in the Korean Intellectual Property Office, the content of which is incorporated herein by reference in its entirety.

1. Field of the Invention

The present invention relates to methods for fabricating semiconductor devices, and more particularly, to methods for forming a well of a highly-integrated semiconductor devices.

2. Description of the Related Art

A well of a semiconductor device is used to transfer body voltage to a Metal oxide semiconductor (MOS) device that actually operates and eliminate carriers formed because of impact ionization. In order to allow a well to perform these functions, low resistance should be maintained by implanting a large amount of impurities during a well ion implantation process. In particular, low well resistance plays an important role in testing reliability for such problems as latch-up. Thus, a deep well is formed using high-energy ion implantation so as to maintain low resistance. However, high-energy ion implantation causes a decrease in a margin between adjacent wells.

On the other hand, as semiconductor devices become highly integrated, the length of a gate and the width of an active region have been scaled down horizontally. However, the well structure is scaled down in the vertical direction relatively less than in the horizontal direction. This causes a severe deficiency in the margin between adjacent wells, and thus limits the further reduction of chip sizes.

When a well is formed to be shallow using conventional high-energy ion implantation, an increase in resistance causes a malfunction, such as a latch-up, during a device driving operation. In addition, it is well known that the depth of a well in a cell array region bears a close relationship to a soft error rate (SER).

SUMMARY OF THE INVENTION

The present invention provides a method for forming a well having low resistance, in which a large margin between adjacent wells is obtained through vertical scaling-down of a well region.

According to an aspect of the present invention, there is provided a method for forming a well having low resistance, using low-energy ion implantation. The method for forming a well using low-energy ion implantation can minimize well margin reduction caused by impurity spread and well margin reduction caused by shrinkage of a thick photoresist pattern.

According to another aspect of the present invention, to form an ideal well structure, a well should be formed as shallow as possible and the resistance thereof should be similar to that of a high-energy, high-dose well. Accordingly, an isolation trench is formed in a semiconductor substrate. Then, a high-concentration well is formed beneath the trench or at the bottom of the trench by performing low-energy, high-dose ion implantation. Next, an isolation layer is formed on the high-concentration well by filling the trench with an insulating layer. Last, a low-concentration well is formed to a depth that is partially overlapped with an upper portion of the high-concentration well by performing low-energy ion implantation on the semiconductor substrate.

According to an embodiment of the present invention, a pad nitride layer pattern is formed on a semiconductor substrate, and an isolation trench is formed in the semiconductor substrate by etching the semiconductor substrate using the pad nitride layer pattern as an etch mask. Next, a spacer nitride layer is formed on the inner walls of the trench, and a high-concentration well is formed beneath the trench or at the bottom of the trench by performing low-energy, high-dose ion implantation using the pad nitride layer pattern and the spacer nitride layer as an ion implantation mask. Next, an isolation layer for filling the trench is formed by covering the high-concentration well with an insulating material, planarizing the top surface of the insulating material and removing the pad nitride layer pattern. Subsequently, a low-concentration well is formed to a depth that is partially overlapped with an upper portion of the high-concentration well by performing low-energy ion implantation on the entire surface of the semiconductor substrate. The depth of the entire well including the high-concentration well and the low-concentration well is about the same as the depth of the trench isolation layer, and thus the well may be referred to as a shallow well. In particular, the high-concentration well is formed under the isolation layer. According to the above embodiment, a large margin between adjacent wells can be obtained through vertical down-scaling of the well region, and well resistance can be reduced.

In another embodiment of the present invention, a complementary metal oxide semiconductor (CMOS) well is formed. For this purpose, a pad nitride layer pattern is formed on a semiconductor substrate divided into PMOS and NMOS regions. Next, isolation trenches are formed in the first and second regions by etching the semiconductor substrate using the pad nitride layer pattern as an etch mask. Next, a spacer nitride layer is formed on the inner walls of the trenches. Next, a first photoresist pattern for exposing only the NMOS region is formed, and low-energy, high-dose ion implantation using the pad nitride layer pattern and the spacer nitride layer as an ion implantation mask is performed, thereby forming a P+ well beneath the trench or at the bottom of the trench of the NMOS region. Next, the first photoresist pattern is removed, a second photoresist pattern for exposing only the PMOS region is formed, and low-energy, high-dose ion implantation using the pad nitride layer pattern and the spacer nitride layer as an ion implantation mask is performed, thereby forming an N+ well beneath the trench or at the bottom of the trench of the PMOS region. Next, the second photoresist pattern is removed, the P+ well and the N+ well are covered with an insulating material, the top surface of the insulating material is planarized, and the pad nitride layer pattern is removed, thereby forming an isolation layer for filling the trenches. Next, a third photoresist pattern for exposing only the NMOS region is formed, and low-energy ion implantation the semiconductor substrate is performed, thereby forming a P well to a depth that is partially overlapped with an upper portion of the P+ well. Next, the third photoresist pattern is removed, a fourth photoresist pattern for exposing only the PMOS region is formed, and low-energy ion implantation on the semiconductor substrate is performed, thereby forming an N well to a depth that is partially overlapped with the upper portion of the P+ well. Last, the fourth photoresist pattern is removed. According to the present embodiment, low-energy ion implantation is performed, and thus the first through fourth photoresist patterns can be formed to be thin enough to obtain a large well margin.

BRIEF DESCRIPTION OF THE DRAWINGS

The above aspect and advantages of the present invention will become more apparent by describing in detail preferred embodiments thereof with reference to the attached drawings, in which.

DETAILED DESCRIPTION OF THE INVENTION

Figure 1:
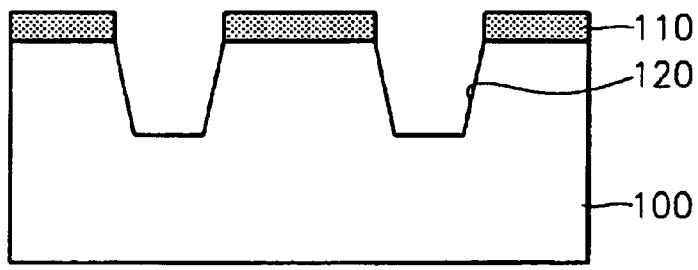
FIGS. 1 through 6 are cross-sectional views illustrating an embodiment of a method for forming a shallow well according to the present invention.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete and will fully convey the scope of the invention to those skilled in the art. In the drawings, the forms of elements are exaggerated for clarity. Like reference numerals refer to like elements throughout the drawings.

FIGS. 1 through 6 are cross-sectional views illustrating an embodiment of a method for forming a shallow well according to the present invention.

Referring to FIG. 1, a pad nitride layer pattern 110 is formed on a semiconductor substrate 100. Then, the semiconductor substrate 100 is etched to a thickness of about 2500 to about 3000 Å, using the pad nitride layer pattern 110 as an etch mask, thereby forming a shallow isolation trench 120 therein. If necessary, a buffer oxide layer (not shown) may be formed between the pad nitride layer pattern 110 and the semiconductor substrate 100, using thermal oxidation.

Figure 2:
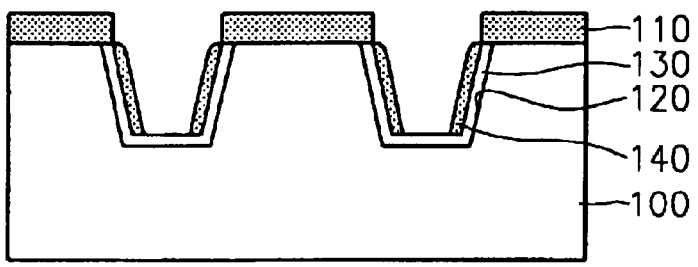

Turning to FIG. 2, a liner oxide layer 130 having a thickness of about 50 to about 100 Å is formed on the inner walls and the bottom of the trench 120. The liner oxide layer 130 is formed by thermally oxidizing the semiconductor substrate 100 in which the trench 120 is formed. Through thermal oxidation, the etching damage to the semiconductor substrate 100 during the formation of the trench 120 is repaired. Subsequently, a spacer nitride layer 140 is formed on the inner walls of the trench 120. In particular, a nitride layer having a thickness of about 50 to about 200 Å is deposited on the semiconductor substrate 100 on which the liner oxide layer 130 is formed, and then the nitride layer is anisotropically etched until the bottom of the trench 120 is exposed.

Figure 3:
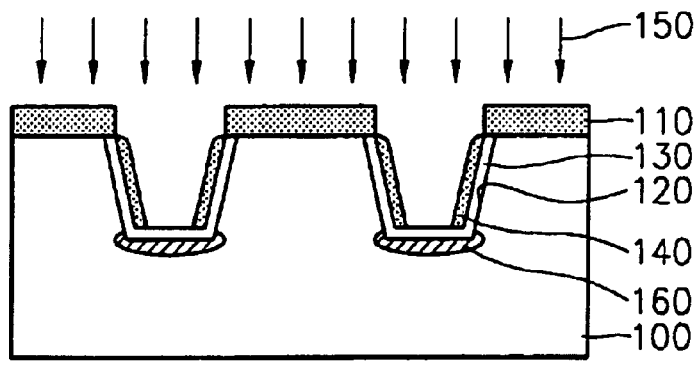

Referring to FIG. 3, a high-concentration well 160 is formed beneath the trench 120 or at the bottom of the trench 120 by performing low-energy, high-dose ion implantation 150 on the resultant structure of FIG. 2. In this case, the pad nitride layer pattern 110 and the spacer nitride layer 140 are used as an ion implantation mask, and thus ion implantation is only performed through the bottom of the trench 120. The low-energy, high-dose ion implantation 150 is performed with impurities at an energy level about 10 to about 30 keV and a dose of about $1 \times 10^{15}$ to about $5 \times 10^{15}$ ions/cm$^2$.

Figure 4:
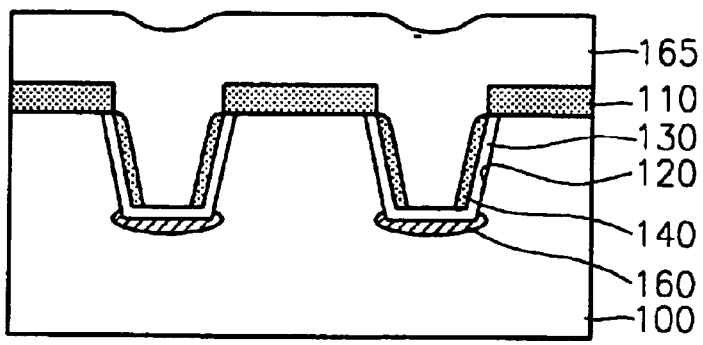

Referring to FIG. 4, the trench 120 is filled with an insulating material 165. For example, an oxide layer formed using middle temperature oxide (MTO), undoped silicate glass (USG), or by high-density plasma chemical vapor deposition (HDP CVD), or a proper combination thereof may be used as the insulating material 165.

Figure 5:
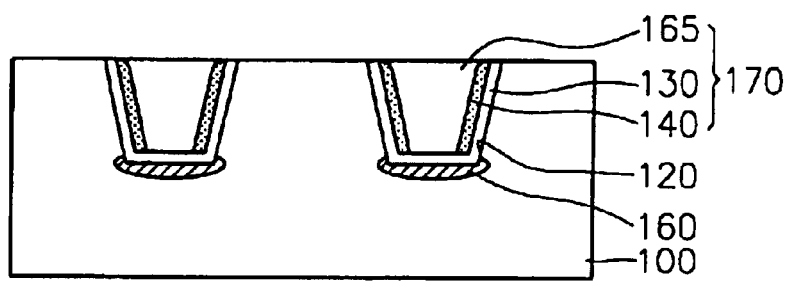

Next, as shown in FIG. 5, the top surface of the resultant structure of FIG. 4 is planarized, thereby exposing the pad nitride layer pattern 110. The pad nitride layer pattern 110 is then removed, thereby exposing the top surface of the semiconductor substrate 100. Accordingly, an isolation layer 170 is formed in the isolation trench 120. The top surface of the resultant structure of FIG. 4 may be planarized using a chemical mechanical polishing (CMP) process in which the pad nitride layer pattern 110 is used as a planarizing endpoint. It is well known that the remaining pad nitride layer pattern 110 can be removed using a phosphoric acid strip. A step between the isolation layer 170 and the semiconductor substrate 100 is reduced if a large amount of the pad nitride layer pattern 110 is removed during a CMP process. If the buffer oxide layer is formed, as described with reference to FIG. 1, after removing the pad nitride layer pattern 110, the buffer oxide layer is also removed using a hydrofluoric acid (HF) solution. In general, the isolation layer 170 protrudes slightly upward with respect to the semiconductor substrate 100. However, in FIG. 5, the step between the isolation layer 170 and the semiconductor substrate 100 is not illustrated for the sake of simplicity.

Figure 6:
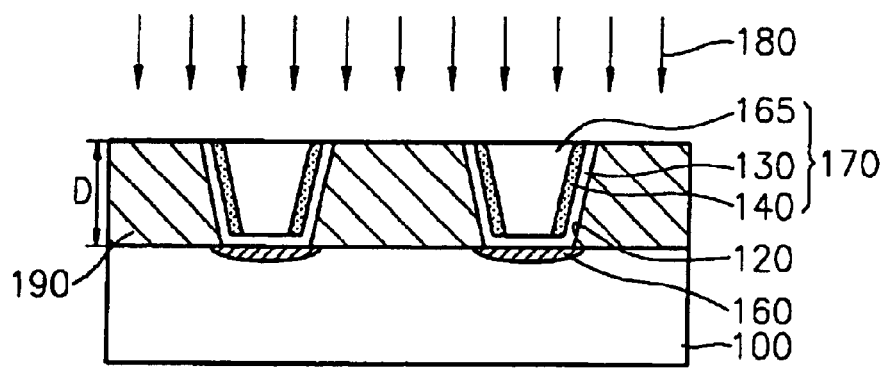

Referring to FIG. 6, low-energy ion, low-dose implantation 180 is performed on the semiconductor substrate 100 including the isolation layer 170, thereby forming a low-concentration well 190 in the semiconductor substrate 100 to a depth D that is partially overlapped with an upper portion of the high-concentration well 160. In other words, the low-concentration well 190 is formed to the bottom of the trench 120. According to the low-energy, low-dose ion implantation 180, impurities having an energy level about 20 to about 30 keV at a dose of about $1 \times 10^{12}$ to about $1 \times 10^{13}$ ions/cm$^2$ are implanted into the resulting structure. To form the low-concentration well 190, impurities should be implanted to substantially the depth of the isolation layer 170 from the surface of the semiconductor substrate 100. Thus, ion implantation is preferably performed at an energy level higher than that used to form the high-concentration well 160 to form the low-concentration well 190. Preferably, the depth of the entire well including the high-concentration well 160 and the low-concentration well 190 is about the same as the depth of the isolation layer 170.

In the above-mentioned embodiment, a well region is formed to the depth of the trench isolation layer 170 using a low-energy, high-dose ion implantation process. As a result, the formation of a shallow well having low resistance is precisely controlled. A large margin between adjacent wells can be obtained through vertical-scaling down of the well region, and well resistance can be reduced.

FIGS. 7 through 13 are cross-sectional views illustrating another embodiment of the method for forming a shallow well according to the present invention. In the present embodiment, a complimentary metal oxide semiconductor (CMOS) well is formed. As the operating speed of a semiconductor integrated circuit (IC) increases and the semiconductor IC becomes highly-integrated, power consumption per chip increases greatly. As such, demands on low power consumption CMOS devices continuously increase, and thus almost all of the ICs are made as CMOS devices. The CMOS devices have the advantages of wide operating region and a large noise margin in addition to low power consumption.

Figure 7:
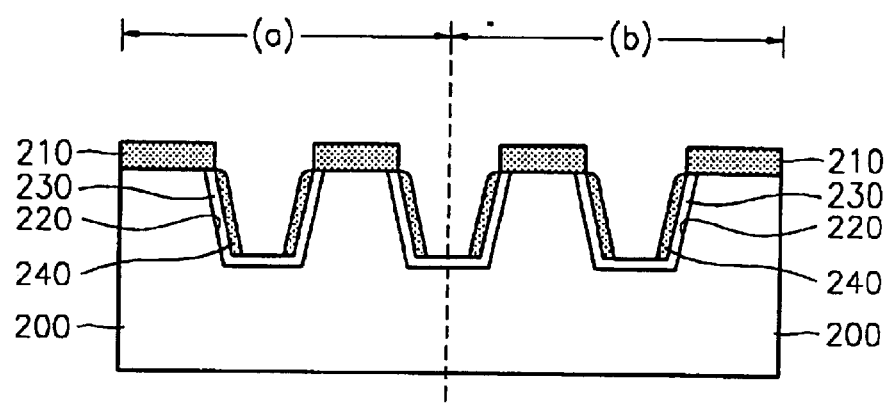
FIGS. 7 through 13 are cross-sectional views illustrating another embodiment of the method for forming a shallow well according to the present invention.

Referring to FIG. 7, first, a semiconductor substrate 200 is divided into an NMOS region (a) and a PMOS region (b). The semiconductor substrate 200 is etched to a thickness of about 2500 to about 3000 Å using a pad nitride layer pattern 210, which is formed on the semiconductor substrate 200 as an etch mask, thereby forming shallow isolation trenches 220 in the NMOS region (a) and the PMOS region (b) of the semiconductor substrate 200. Next, a liner oxide layer 230 is formed on the inner walls and on the bottom of the trench 220, and a spacer nitride layer 240 is formed covering the inner walls of the trench 220.

Figure 8:
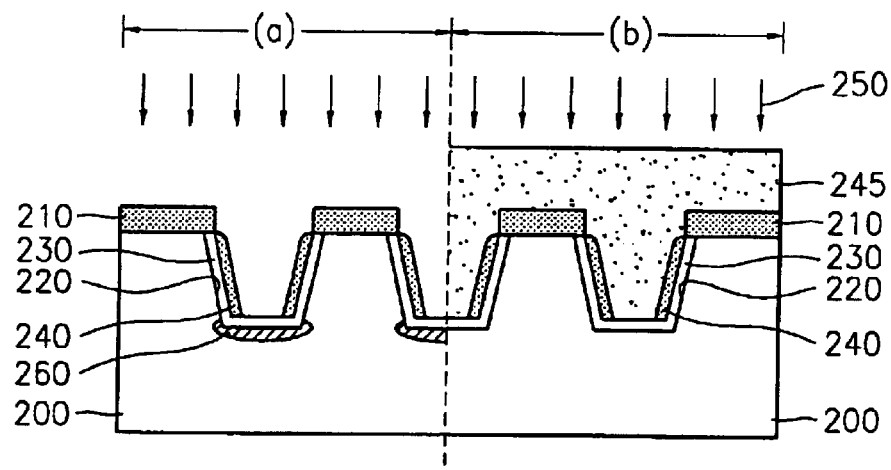

Referring to FIG. 8, a first photoresist pattern 245 for exposing only the NMOS region (a) is formed on the substrate 200 including the pad nitride layer pattern 210, and then low-energy, high-dose ion implantation 250 is performed thereon, using the pad nitride layer pattern 210 and the spacer nitride layer 240 as an ion implantation mask. Accordingly, a P+ well 260 is formed beneath the trench 220 or at the bottom of the trench 220 of the NMOS region (a). In this case, $BF_2$ may be used as an impurity source. In the present embodiment, low-energy means an energy level about 10 to about 30 keV, and high-dose means a dose of about $1\times10^{15}$ to about $5\times10^{15}$ ions/cm². Since low-energy ion implantation is performed, the first photoresist pattern 245 can be formed to be thin, i.e., to a thickness of about 1 to about 1.5 μm. Considering that the thickness of a conventional photoresist pattern is about 2.5 to about 3 μm, it is noted that the first photoresist pattern 245 is thin enough to obtain a large well margin.

Figure 9:
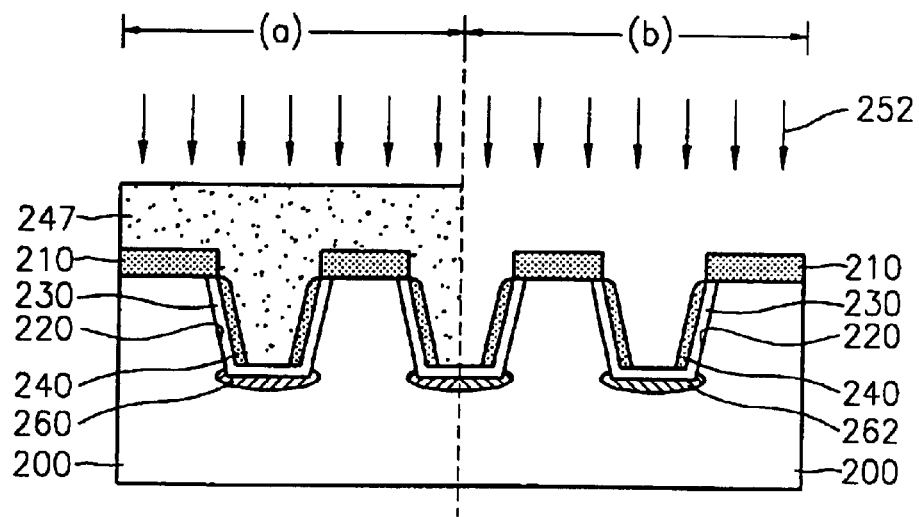

Next, the first photoresist pattern 245 is removed, a second photoresist pattern 247 for exposing only the PMOS region (b) is formed, low-energy, high-dose ion implantation 252 in which the pad nitride layer pattern 210 and the spacer nitride layer 240 are used as the ion implantation mask is performed, and then an N+ well 262 is formed beneath the trench 220 or at the bottom of the trench 220 of the PMOS region (b), as shown in FIG. 9. In this case, $AsH_3$ may be used as an impurity source. The second photoresist pattern 247 can also be formed to be thin, i.e., to a thickness of about 1 to about 1.5 μm.

Figure 10:
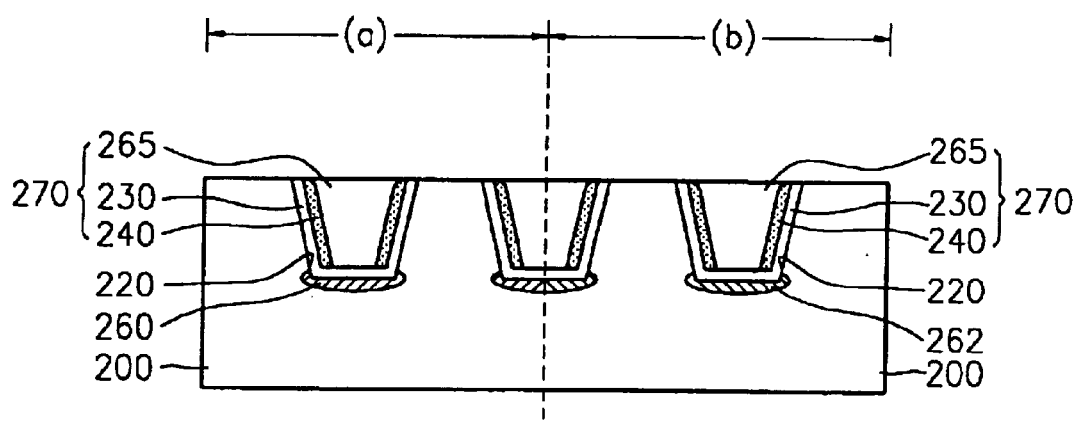

Referring to FIG. 10, the second photoresist pattern 247 is removed, the P+ well 260 and the N+ well 262 are covered with an insulating material 265, the top surface of the insulating material 265 is planarized, and the pad nitride layer pattern 210 is removed, thereby forming the isolation layer 270 for filling the trench 220.

Figure 11:
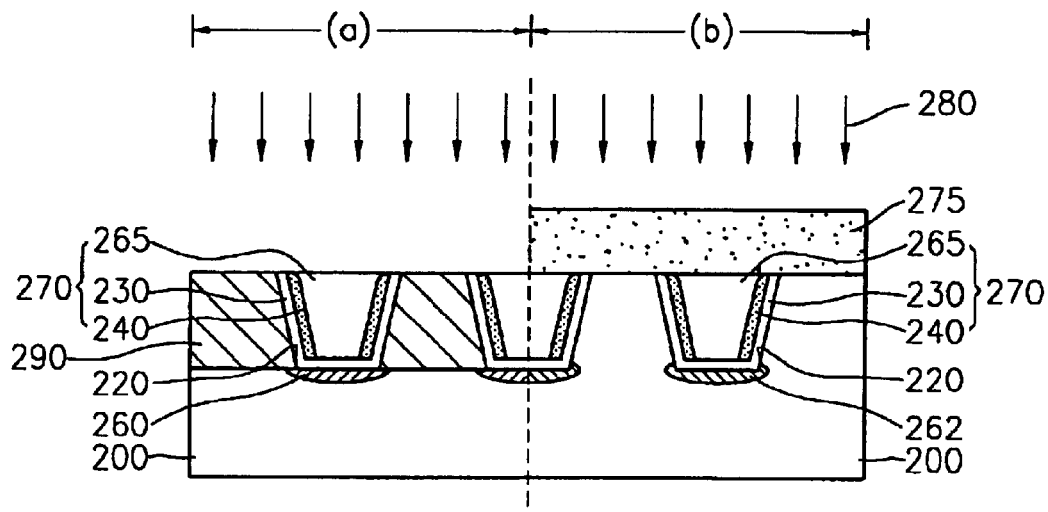

Next, a third photoresist pattern 275 for exposing only the NMOS region (a) is formed, and low-energy, low-dose ion implantation 280 using an impurity source, such as $BF_2$, is performed on the semiconductor substrate 200 including the isolation layer 270, thereby forming a P well 290 in the NMOS region (a) in the semiconductor substrate 200 to a depth that is partially overlapped with an upper portion of the P+ well 260, as shown in FIG. 11. In other words, the P well 290 is formed to the bottom of the trench 220. In the present embodiment, the low-energy, low-dose ion implantation 280 is performed with impurities at an energy level 20 to 30 keV and a dose of about $1\times10^{12}$ to $1\times10^{13}$ ions/cm². Because low-energy ion implantation is performed, the third photoresist pattern 275 can also be formed to be thin, i.e., to a thickness of about 1 to about 1.5 μm.

Figure 12:
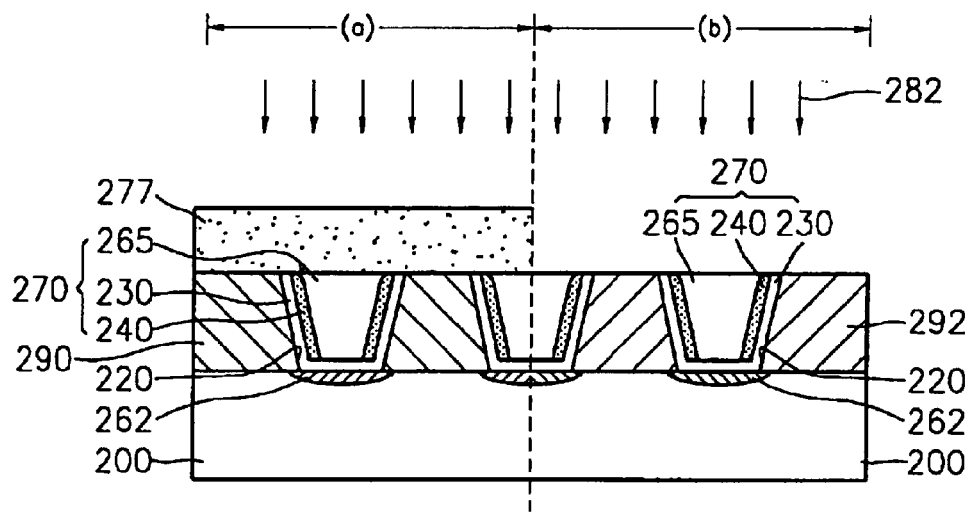

Referring to FIG. 12, the third photoresist pattern 275 is removed, and a fourth photoresist pattern 277 for exposing only the PMOS region (b) is formed. Subsequently, low-energy ion implantation 282 is performed on the surface of the semiconductor substrate 200 including the isolation layer 270, thereby forming an N well 292 in the PMOS region (b) in the semiconductor substrate 200 to a depth that is partially overlapped with an upper portion of the N+ well 262. In other words, the N well 292 is formed to the depth of the trench 220. The low-energy ion, low-dose implantation 282 is performed using impurities having an energy level about 20 to about 30 keV and a dose of about $1\times10^{12}$ to $1\times10^{13}$ ions/cm². Since low-energy ion implantation is performed, the fourth photoresist pattern 277 can also be formed to be thin, i.e., to a thickness of about 1 to about 1.5 μm. As shown in FIG. 12, the depth of a shallow N well including the N+ well 262 and the N well 292 is about the same as the depth of the trench isolation layer 270. Similarly, the depth of a shallow P well including the P+ well 260 and the P well 290 is about the depth of the trench isolation layer 270.

Figure 13:
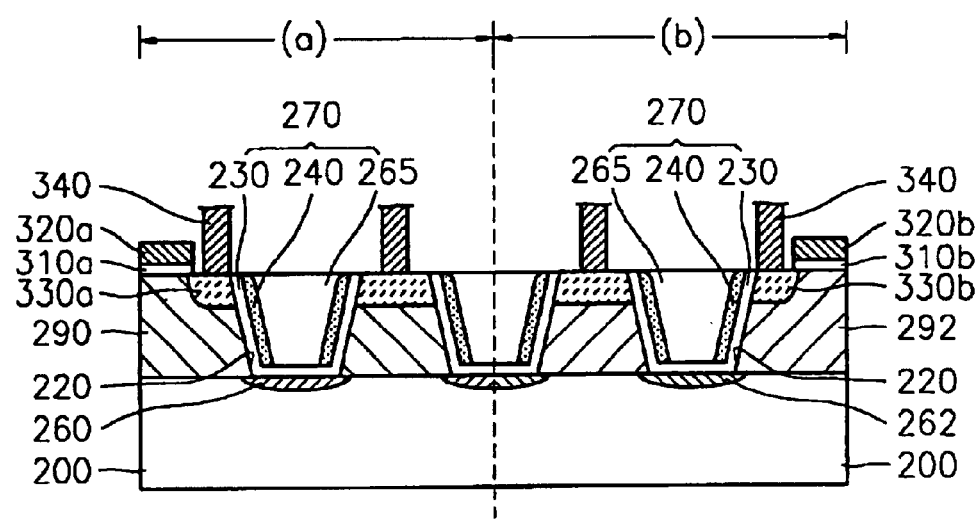

Referring to FIG. 13, a process of forming a well is completed by removing the fourth photoresist pattern 277. A subsequent CMOS device is formed on the semiconductor substrate 200 on which a well is formed according to the present embodiment. For example, gates including gate insulating layers 310a and 310b and gate electrodes 320a and 320b are formed in the respective NMOS region (a) and the PMOS region (b), and then ion implantation is performed, forming source/drain regions 330a and 330b. An interlevel dielectric (ILD) film (not shown) is formed on the source/drain regions 330a and 330b. Then a contact plug 340 that passes through the ILD film and contacts each of the source/drain regions 330a and 330b is formed.

With the embodiments of the present invention, the formation of the shallow well having low resistance can be precisely controlled. The shallow well formed according to the embodiments of present invention has the following effects.

First, well resistance is reduced to 70 to 90% of the well resistance of the prior art. A trigger voltage increases and a holding voltage is reduced. Accordingly, latch-up is suppressed. Further, as the well resistance is reduced, it is easy to reduce the number of contacts for well biasing. Accordingly, well biasing can be stabilized.

Second, because low-energy ion implantation is used, the damage to a semiconductor substrate during an ion implantation process, can be reduced. As such, if a memory device, such as a DRAM, is formed in the well according to the present invention, the data retention time characteristics of the memory device, i.e., refresh time characteristics, can be improved.

Third, because low-energy ion implantation is performed, the thickness of a photoresist pattern can be formed to be sufficiently thin, if masking is necessary. In the prior art, a masking photoresist pattern is 2.5 to 3 μm thick, resulting in a decrease in a margin between adjacent wells. In contrast, in one aspect of the present invention, the thickness of the photoresist pattern can be formed to be thin, i.e., to a thickness of about 1 to about 1.5 μm. As such, a margin between adjacent wells can be increased. Therefore, the present invention can be advantageously applied to the high-integration of a device.

Fourth, the depth of the entire shallow well including the high-concentration well and the low-concentration well is about the same as the depth of the isolation layer formed to a depth of about 2500 to about 3000 Å. Since the depth of the well is not large, SER characteristics can be improved.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a well, the method comprising:
    forming an isolation trench in a semiconductor substrate;
    selectively performing low-energy, high-dose ion implantation through the bottom of the trench, thereby forming a high-concentration well therebeneath;

filling the trench with an insulating layer, thereby forming an isolation layer in the high-concentration well; and performing low-energy, low-dose ion implantation on the semiconductor substrate including the isolation layer, thereby forming a low-concentration well in the semiconductor substrate to a depth partially overlapping with an upper portion of the high-concentration well.

2. The method of claim 1, wherein the isolation trench has a depth of about 2500 to about 3000 Å.

3. The method of claim 1, wherein the low-energy, high-dose ion implantation is performed at an energy level about 10 to about 30 keV and at a dose of about $1\times10^{15}$ to about $5\times10^{15}$ ions/cm$^2$.

4. The method of claim 1, wherein the low-energy, low-dose ion implantation is performed with impurities at an energy level about 20 to about 30 keV and at a dose of about $1\times10^{12}$ to about $1\times10^{13}$ ions/cm$^2$.

5. The method of claim 1, wherein the low-concentration well is formed to the bottom of the trench.

6. The method of claim 1, wherein the total depth of the low-concentration well and the high-concentration well is about the same as the depth of the isolation layer.

7. A method for forming a well, the method comprising:

forming a pad nitride layer pattern on a semiconductor substrate;

etching the semiconductor substrate, using the pad nitride layer pattern as an etch mask, thereby forming an isolation trench in the semiconductor substrate;

forming a spacer nitride layer on inner walls of the trench;

selectively performing low-energy, high-dose ion implantation, using the pad nitride layer pattern and the spacer nitride layer as an ion implantation mask, thereby forming a high-concentration well therebeneath;

filling the trench with an insulating material, thereby covering the high-concentration well;

planarizing the insulating material to form an insulating layer in the trench, and removing the pad nitride layer pattern; and performing low-energy, low-dose ion implantation on the semiconductor substrate including the isolation layer, thereby forming a low-concentration well in the semiconductor substrate to a depth partially overlapping with an upper portion of the high-concentration well.

8. The method of claim 7, wherein the isolation trench has a depth of about 2500 to about 3000 Å.

9. The method of claim 7, wherein for the low-energy, high-dose ion implantation is performed with impurities at an energy level about 10 to about 30 keV and at a dose of about $1\times10^{15}$ to about $5\times10^{15}$ ions/cm$^2$.

10. The method of claim 7, wherein the low-energy, low-dose ion implantation is performed with impurities at an energy level 20 to 30 keV and at a dose of $1\times10^{12}$ to $1\times10^{13}$ ions/cm$^2$.

11. The method of claim 7, before forming the spacer nitride layer on the inner walls of the trench, further comprising forming a liner oxide layer on the inner walls and on bottom of the trench.

12. A method for forming a well, the method comprising:

forming a pad nitride layer pattern on a semiconductor substrate having first and second regions;

etching the semiconductor substrate, using the pad nitride layer pattern as an etch mask, thereby forming isolation trenches in the first and second regions;

forming a spacer nitride layer on inner walls of the trenches;

forming a first photoresist pattern on the resulting structure to expose only the second region and performing low-energy, high-dose ion implantation, using the pad nitride layer pattern and the spacer nitride layer as an ion implantation mask, thereby forming a high-concentration well of a first conductivity type at the bottom of the trench in the second region;

removing the first photoresist pattern, forming a second photoresist pattern for exposing only the first region, and performing low-energy, high-dose ion implantation, using the pad nitride layer pattern and the spacer nitride layer as an ion implantation mask, thereby forming a high-concentration well of a second conductivity type, which is different from the first conductivity type, at the bottom of the trench in the first region;

removing the second photoresist pattern, covering the high-concentration well of the first conductivity type and the high-concentration well of the second conductivity type with an insulating material, planarizing the top surface of the insulating material, and removing the pad nitride layer pattern, thereby forming an isolation layer to fill the trenches;

forming a third photoresist pattern for exposing only the second region, and performing low-energy, low-dose ion implantation on the semiconductor substrate including the isolation layer, thereby forming a low-concentration well of the first conductivity type in the second region to a depth partially overlapping with an upper portion of the high-concentration well of the first conductivity type;

removing the third photoresist pattern, forming a fourth photoresist pattern for exposing only the first region, and performing low-energy, low-dose ion implantation on the semiconductor substrate including the isolation layer; and removing the fourth photoresist pattern, thereby forming a low-concentration well of the second conductivity type in the first region to a depth partially overlapping with an upper portion of the high-concentration well of the second conductivity type.

13. The method of claim 12, wherein the isolation trench has a depth of 2500 to 3000 Å.

14. The method of claim 12, wherein the low-energy, high-dose ion implantation is performed with impurities at an energy level about 10 to about 30 keV and at a dose of about $1\times10^{15}$ to about $5\times10^{15}$ ions/cm$^2$.

15. The method of claim 12, wherein the low-energy, low-dose ion implantation is performed with impurities at an energy level about 20 to about 30 keV and at a dose of about $1\times10^{12}$ to about $1\times10^{13}$ ions/cm$^2$.

16. The method of claim 12, before forming the spacer nitride layer on the inner walls of the trenches, further comprising forming a liner oxide layer on the inner walls and on bottoms of the trenches.

17. The method of claim 12, wherein the first through fourth photoresist patterns are formed to a thickness of about 1 to about 1.5 $\mu$m to obtain a sufficient margin between adjacent wells.

18. A method for forming a well, the method comprising:

forming an isolation trench in a semiconductor substrate;

performing a first ion implantation process at a first energy level and at a first dose through the bottom of the trench, thereby forming a high-concentration well therebeneath;

filling the trench with an insulating material, thereby forming an isolation layer in the high-concentration well; and performing a second ion implantation process at a second energy level higher than the first energy level and at a second dose lower than the first dose on the semiconductor substrate including the isolation layer, thereby forming a low-concentration well in the semiconductor substrate to substantially the bottom of the trench.

19. The method of claim 18, wherein the first energy level is about 10 to about 30 keV and the first dose is about $1\times10^{15}$ to about $5\times10^{15}$ ions/cm$^2$.

20. The method of claim 18, wherein the second energy level is about 20 to about 30 keV and the second dose is about $1\times10^{12}$ to about $1\times10^{13}$ ions/cm$^2$.

* * * * *